(12) United States Patent
Fukukawa et al.

(10) Patent No.: US 12,540,779 B2
(45) Date of Patent: Feb. 3, 2026

(54) COOLING STRUCTURE

(71) Applicant: RESONAC CORPORATION, Tokyo (JP)

(72) Inventors: Yuji Fukukawa, Tokyo (JP); Takahiro Yamashita, Tagawa (JP); Hiroaki Shoda, Tagawa (JP)

(73) Assignee: RESONAC CORPORATION, Tokyo (JP)

( * ) Notice: Subject to any disclaimer, the term of this patent is extended or adjusted under 35 U.S.C. 154(b) by 126 days.

(21) Appl. No.: 18/263,034

(22) PCT Filed: Jan. 17, 2022

(86) PCT No.: PCT/JP2022/001460
§ 371 (c)(1),
(2) Date: Jul. 26, 2023

(87) PCT Pub. No.: WO2022/163418
PCT Pub. Date: Aug. 4, 2022

(65) Prior Publication Data
US 2024/0098949 A1 Mar. 21, 2024

(30) Foreign Application Priority Data
Jan. 27, 2021 (JP) .................. 2021-011481

(51) Int. Cl.
*F28F 3/02* (2006.01)
*F28D 3/02* (2006.01)
*H05K 7/20* (2006.01)

(52) U.S. Cl.
CPC .................. *F28F 3/02* (2013.01); *F28D 3/02* (2013.01); *H05K 7/209* (2013.01)

(58) Field of Classification Search
None
See application file for complete search history.

(56) References Cited

U.S. PATENT DOCUMENTS

| | | | |
|---|---|---|---|
| 7,078,803 B2* | 7/2006 | Tilton | H01L 23/4735 |
| | | | 361/698 |
| 9,562,728 B2* | 2/2017 | Gotou | H05K 7/20927 |
| 9,986,665 B2* | 5/2018 | Kosaka | H05K 7/209 |

(Continued)

FOREIGN PATENT DOCUMENTS

| | | |
|---|---|---|
| JP | 5051322 B1 | 10/2012 |
| JP | 2013-098530 A | 5/2013 |

(Continued)

*Primary Examiner* — Courtney L Smith
(74) *Attorney, Agent, or Firm* — FITCH, EVEN, TABIN & FLANNERY, LLP

(57) ABSTRACT

A cooling structure includes a flow path-forming member that forms a flow path for a refrigerant to pass through, wherein: the flow path-forming member includes, on a basal inner wall thereof, a cooling fin installation section provided with at least one cooling fin projecting from the basal inner wall toward an inner side of the flow path, the cooling fin installation section being disposed separately from side inner walls of the flow path-forming member; and the flow path-forming member includes, on a side inner wall thereof, at least one obstacle projecting from the side inner wall toward the inner side of the flow path.

15 Claims, 7 Drawing Sheets

(56) References Cited

U.S. PATENT DOCUMENTS

| | | | |
|---|---|---|---|
| 2001/0014029 A1* | 8/2001 | Suzuki | H05K 7/20927 363/141 |
| 2004/0182544 A1 | 9/2004 | Lee et al. | |
| 2008/0169088 A1* | 7/2008 | Aoki | H02K 9/227 165/104.19 |
| 2010/0296247 A1* | 11/2010 | Chang | H05K 7/20927 361/699 |
| 2013/0009168 A1* | 1/2013 | Tsuchiya | H01L 23/473 257/77 |
| 2013/0058041 A1 | 3/2013 | Gohara et al. | |
| 2013/0112388 A1 | 5/2013 | Kwak et al. | |
| 2015/0061111 A1* | 3/2015 | Nagai | H01L 23/473 257/714 |

FOREIGN PATENT DOCUMENTS

| | | |
|---|---|---|
| JP | 2014-72395 A | 4/2014 |
| JP | 2015-159149 A | 9/2015 |
| JP | 2016-171097 A | 9/2016 |
| JP | 2018-037496 A | 3/2018 |
| WO | 2011/132736 A1 | 10/2011 |
| WO | 2012/114475 A1 | 8/2012 |
| WO | 2015/094125 A1 | 6/2015 |

* cited by examiner

COOLING STRUCTURE

CROSS-REFERENCE TO RELATED APPLICATIONS

This application is a U.S. national phase application filed under 35 U.S.C. § 371 of International Application No. PCT/JP2022/001460, filed Jan. 17, 2022, designating the United States, which claims priority from Japanese Application No. 2021-011481, filed Jan. 27, 2021, which are incorporated herein by reference in their entireties.

TECHNICAL FIELD

The present disclosure relates to a cooling structure.

BACKGROUND ART

In recent years, in association with the increase in the amount of heat generated by heat generators, cooling structures having high cooling efficiency are being developed. For example, vehicles on which a motor is mounted, such as hybrid cars and electric cars, are installed with driving means for driving the motor. The driving means include power modules having plural power semiconductors, such as insulated gate bipolar transistors (IGBT), electronic components such as capacitors, busbars that electrically join these electronic components, and the like. When the motor is driven, a large current may flow through the power semiconductors, the capacitors, and the busbars joining these electronic components. In this case, since the driving means generate heat owing to switching loss, resistance loss, and the like, it is desirable that the driving means are cooled efficiently.

In cooling structures such as water jackets for a refrigerant to flow inside to cool heat generators, cooling fins are usually installed inside (see, for example, Patent Document 1). The cooling fins are arranged in a position at which the cooling fins inhibit the flow of the refrigerant, increase the flow velocity at the area from which the heat is released, and improve the cooling performance.

PRIOR ART DOCUMENT

Patent Document

Patent Document 1: WO 2011/132736 A

SUMMARY OF INVENTION

Technical Problem

In a cooling structure such as a water jacket provided inside with cooling fins, further increase in cooling efficiency is desired. In view of such circumstances, the present disclosure is directed to providing a cooling structure having excellent cooling efficiency.

Solution to Problem

Means to solve the foregoing problem include the following aspects.
  (1) A cooling structure, including a flow path-forming member that forms a flow path for a refrigerant to pass through, wherein:
    the flow path-forming member includes, on a basal inner wall thereof, a cooling fin installation section provided with at least one cooling fin projecting from the basal inner wall toward an inner side of the flow path, the cooling fin installation section being disposed separately from side inner walls of the flow path-forming member; and
    the flow path-forming member includes, on a side inner wall thereof, at least one obstacle projecting from the side inner wall toward the inner side of the flow path.
  (2) The cooling structure according to (1), wherein:
    the flow path includes a narrow part at which the flow path is narrowed, and
    the cooling fin installation section is provided at the narrow part of the flow path.
  (3) The cooling structure according to (1) or (2), including at least one combination of an obstacle A and a cooling fin B that satisfy a relationship according to the following formula, the obstacle A being one of the at least one obstacle, and the cooling fin B being the at least one cooling fin that is disposed closest to the obstacle A:

$$a \geq b \qquad \text{Formula:}$$

wherein:
    a is a length of the obstacle A in a width direction of the flow path; and
    b is a minimum distance between the cooling fin B and the side inner walls of the flow path-forming member.
  (4) The cooling structure according to any one of (1) to (3), wherein a relationship according to the following formula is satisfied:

$$c \geq d \qquad \text{Formula:}$$

wherein:
    c is an average length of the at least one obstacle in a width direction of the flow path; and
    d is a minimum distance between the at least one cooling fin and the side inner walls of the flow path-forming member.
  (5) The cooling structure according to any one of (1) to (4), wherein, when viewing the flow path from a side toward which the cooling fin projects, the at least one cooling fin and the at least one obstacle are arranged such that any straight line parallel to a flow path longitudinal direction intersects at least one selected from the group consisting of the at least one cooling fin and the at least one obstacle, within a section formed by extending the cooling fin installation section to the side inner walls of the flow path-forming member in a width direction.
  (6) The cooling structure according to any one of (1) to (5), wherein an average length of the at least one cooling fin in a width direction of the flow path is from 0.5 mm to 20.0 mm.
  (7) The cooling structure according to any one of (1) to (5), wherein an average length of the at least one obstacle in a width direction of the flow path is from 0.25 mm to 10.0 mm.
  (8) The cooling structure according to any one of (1) to (7), wherein a plurality of the at least one cooling fin are provided in the cooling fin installation section.
  (9) The cooling structure according to any one of (1) to (8), wherein a plurality of the at least one obstacle are provided in a region corresponding to the cooling fin installation section at the side inner walls of the flow path-forming member. Advantageous Effects of Invention According to the present disclosure, a cooling structure having excellent cooling efficiency is provided.

DESCRIPTION OF EMBODIMENTS

Figure 1:
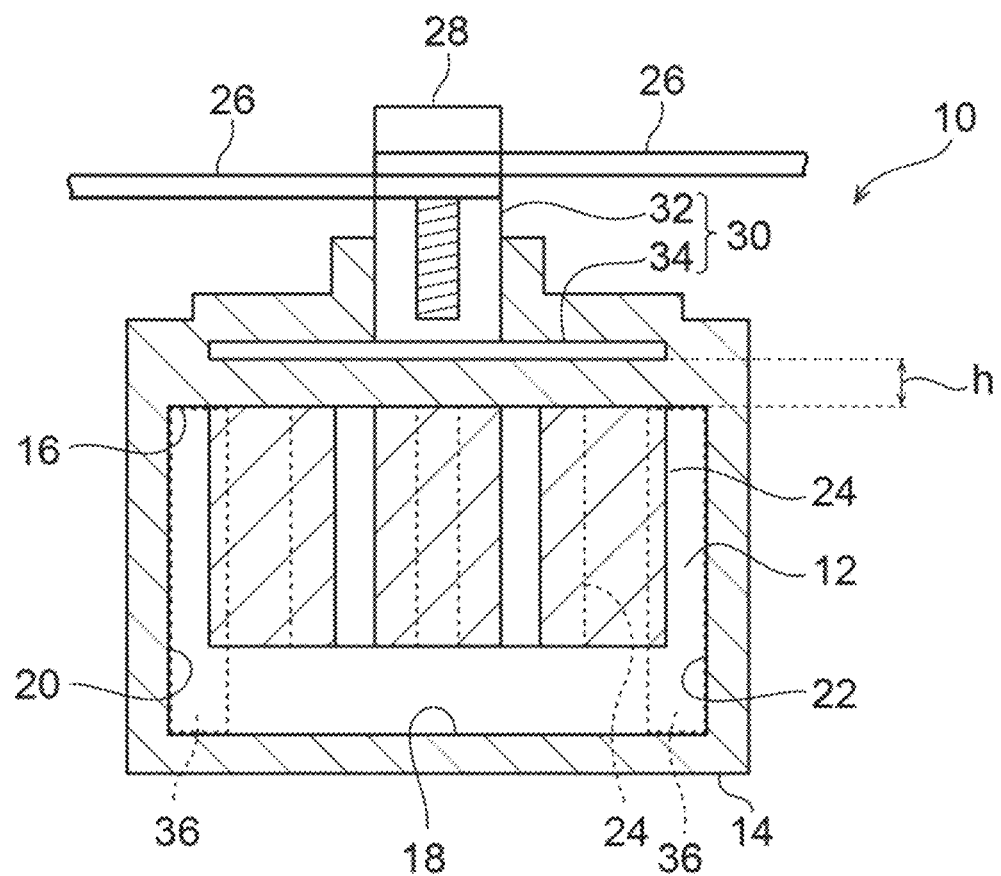
FIG. 1 is a cross-sectional view illustrating a main part of a cooling structure according to one aspect.

Embodiments for carrying out the invention will be described below in detail. However, the invention is not limited to the following embodiments. In the following embodiments, components (including elemental steps, etc.) thereof are not essential unless otherwise specified. The same applies to numerical values and ranges, which do not limit the invention.

In the present disclosure, the term "step" encompasses an independent step separated from other steps as well as a step that is not clearly separated from other steps, as long as a purpose of the step can be achieved.

In the present disclosure, numerical ranges specified using "(from) . . . to . . . " represent ranges including the numerical values noted before and after "to" as a minimum value and a maximum value, respectively.

In the numerical ranges described in a stepwise manner in the present disclosure, the upper limit value or the lower limit value described in one numerical range may be replaced with the upper limit value or the lower limit value of another numerical range described in a stepwise manner.

In a case in which an embodiment is described herein with reference to a drawing, the configuration of the embodiment is not limited by the configuration illustrated in the drawing. The sizes of members in each drawing are conceptual, and the relative relationships between the sizes of the members are not limited thereto. Further, in the drawings, members having substantially the same functions may be denoted by the same reference numerals throughout the drawings, and redundant descriptions may be omitted.

In the present disclosure, a basal inner wall of the flow path-forming member refers to each of two opposing faces out of the faces surrounding the flow path in a region including at least a cooling fin installation section, and the cooling fin is provided to project from at least one of the opposing faces. In the present disclosure, a side inner wall of the flow path-forming member refers to any face connecting the two basal inner walls, out of the faces surrounding the flow path in a region including at least a cooling fin installation section.

In the present disclosure, the "longitudinal direction" of the cooling structure, the flow path-forming member, or the flow path refers to a direction parallel to the traveling direction of the refrigerant (here, the traveling direction of the refrigerant when the presence of cooling fin(s) and obstacle(s) is not taken into consideration) in the flow path. In the present disclosure, the "width direction" of the cooling structure, the flow path-forming member, or the flow path represents a direction orthogonal to the longitudinal direction.

In the present disclosure, the cross section of the flow path refers to a cross section obtained by cutting the flow path in the width direction from one basal inner wall toward the other basal inner wall of the flow path-forming member.

<<Cooling Structure>>

A cooling structure according to the present disclosure includes a flow path-forming member that forms a flow path for a refrigerant to pass through, wherein:

the flow path-forming member includes, on a basal inner wall thereof, a cooling fin installation section provided with at least one cooling fin projecting from the basal inner wall toward an inner side of the flow path, the cooling fin installation section being disposed separately from side inner walls of the flow path-forming member; and the flow path-forming member includes, on a side inner wall thereof, at least one obstacle projecting from the side inner wall toward the inner side of the flow path.

In conventional cooling structures in which no obstacles are provided on the side faces of the flow path-forming member, a large amount of refrigerant flows along the walls of the flow path-forming member, while the refrigerant flows less in the section at which the cooling fins are provided, causing a decrease in the cooling efficiency. It is believed that, in the cooling structure according to the present disclosure, since obstacle(s) are provided on a side face of the flow path-forming member to block the flow of the refrigerant along the side face, the refrigerant flows more easily to the section at which the cooling fin(s) are present, whereby the cooling efficiency is improved.

Hereinafter, the cooling structure according to the present disclosure is described with reference to the drawings. Note that the embodiments of the present disclosure are not limited to the aspects described in the drawings.

FIG. 1 is a cross-sectional view of a cooling structure 10 according to one aspect of the cooling structure according to the present disclosure in a width direction. FIG. 1 is a cross-sectional view of the cooling structure 10 taken along line A-A illustrated in FIG. 2.

The cooling structure 10 illustrated in FIG. 1 includes a flow path-forming member 14 that has a substantially rectangular cross section and that forms a flow path 12 for a refrigerant to pass through.

The flow path 12 is surrounded by an upper basal inner wall 16 corresponding to one of the pair of opposing basal inner walls of the flow path-forming member 14, a lower basal inner wall 18 corresponding to the other inner wall, and a side inner wall 20 and a side inner wall 22 connecting the upper basal inner wall and the lower basal inner wall 18.

In the cooling structure 10, plural cooling fins 24 are provided to project substantially vertically from the upper basal inner wall 16 of the flow path-forming member 14 toward the inner side of the flow path 12. The projecting directions of the plural cooling fins 24 are substantially parallel to each other. In a case in which the flow path-forming member 14 provided with the cooling fins 24 is manufactured using a mold, the cooling fins 24 can be easily pulled out from the mold by making the projecting directions of the plural cooling fins 24 substantially parallel. Therefore, this makes it easier to manufacture the flow path-forming member 14 provided with the cooling fins 24 using a mold.

Figure 2:
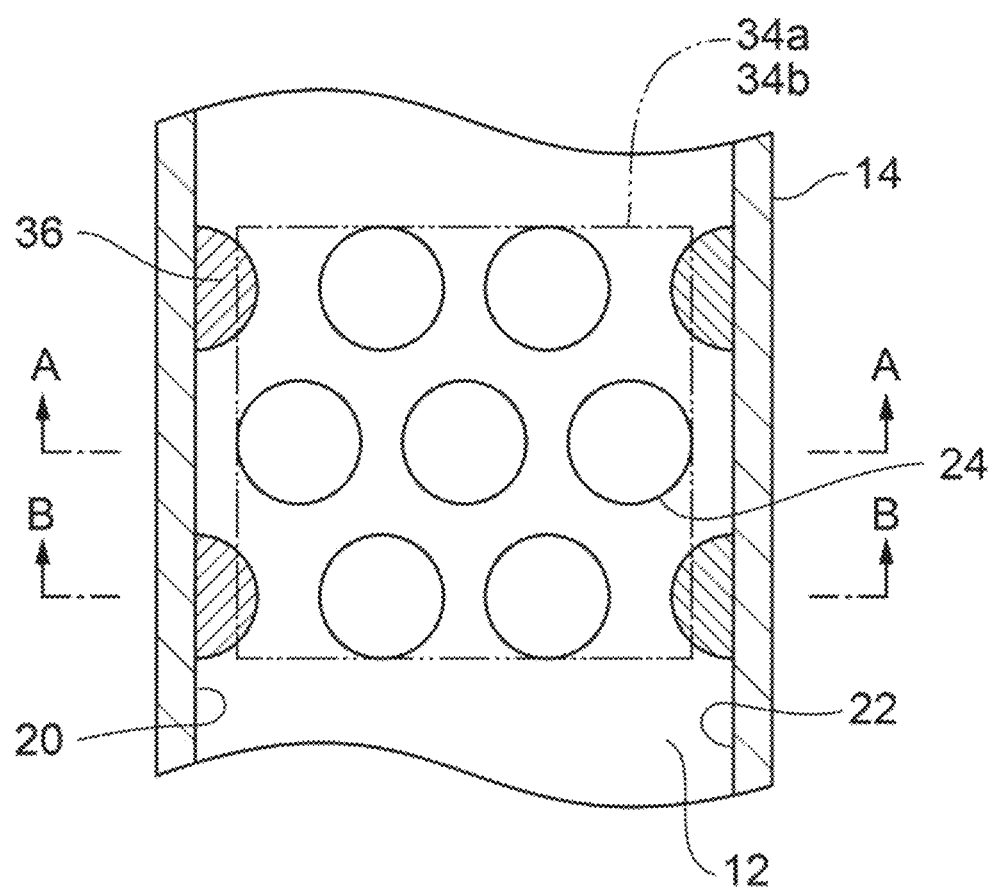
FIG. 2 is a schematic view showing a configuration of a flow path-forming member of a cooling structure in one aspect.

In FIG. 1, cooling fins 24 and obstacles 36 in a cross section in the width direction of a part different from the cross section illustrated in FIG. 1 (a cross section obtained by cutting the cooling structure 10 along line B-B in FIG. 2) are indicated by dotted lines. Plural cooling fins 24 are arranged along a substantially straight line in the width direction of the flow path 12. The cooling fins 24 installed along the line A-A in FIG. 2 and the cooling fins 24 and the obstacles 36 installed along the line B-B in FIG. 2 are arranged to have a positional relationship in which the cooling fins 24 along the line A-A and the cooling fins 24 and the obstacles 36 along the line B-B are arranged in different positions from each other in the width direction of the flow path 12, and are configured to block the flow of the refrigerant traveling straight in the longitudinal direction of the flow path 12.

In the basal part of the cooling fins 24, a busbar 26, which is a body to be cooled, is fixed with a bolt 28 and a nut 30. The nut 30 includes a nut body 32 and a heat diffusion member 34 provided on the side opposite to the side of the nut body 32 into which the bolt 28 is inserted. The heat diffusion member 34 is a plate-like member and is integrated with the nut body 32.

The busbar 26 is connected to electronic components (not illustrated) such as a power semiconductor and a capacitor.

The entire heat diffusion member 34 of the nut 30 and the part of the nut body 32 opposite to the side into which the bolt 28 is inserted are embedded in the flow path-forming member 14. The configuration of the heat diffusion member 34 is not limited to the configuration of being embedded in the flow path-forming member 14, and may be a configuration in which the heat diffusion member 34 is joined to the flow path-forming member 14, for example, may be a configuration in which the heat diffusion member 34 is joined to an outer wall of the flow path-forming member 14. For example, the heat diffusion member 34 may be joined to the flow path-forming member 14 using a resin metal joining technique by laser roughening.

Here, when a current flows through the busbar 26, the busbar 26 itself generates heat owing to the resistance loss. Further, the busbar 26 is connected to electronic components (not illustrated), and heat generated from these electronic components by energization is diffused through the busbar 26. Therefore, the busbar 26 tends to be in a high temperature state.

Heat generated from the busbar 26 itself and heat diffused through the busbar 26 are transferred to a part that is integrated with the nut body of the heat diffusion member 34 via the bolt 28 and the nut body 32. Since the heat diffusion member 34 is a plate-like member, the heat transferred to the heat diffusion member 34 is diffused in the plane direction of the heat diffusion member 34, and the heat can be diffused over a wide area.

Heat diffusion member 34 is located at the base part of the cooling fins 24, and the heat diffused to the heat diffusion member 34 reaches the base part of the cooling fins 24. The heat that has reached the base part of the cooling fins 24 is transferred from the base part of the cooling fins 24 toward the tips of the cooling fins 24 through the cooling fins 24. At this point, heat is transferred from the cooling fins 24 to the refrigerant, by the refrigerant flowing inside the flow path 12. In this manner, the body to be cooled, such as the busbar 26, is cooled.

In FIG. 1, the minimum distance h from the surface of the heat diffusion member 34 on the side of the flow path 12 to the inner wall of the flow path-forming member 14 is preferably 0.3 mm or more from the viewpoint of insulating properties, more preferably 0.5 mm or more from the viewpoint of moldability, and still more preferably 1.5 mm or more. The minimum distance h is preferably 2.5 mm or less from the viewpoint of cooling efficiency.

FIG. 2 is a schematic view of an internal structure of the region in which the cooling fins 24 are provided in the cooling structure 10 of FIG. 1, as viewed from the side toward which the cooling fins 24 projects. For easy understanding of the positional relationship between the cooling fins 24 and the heat diffusion member 34, the busbar 26 and the like are omitted in FIG. 2. In addition, a section (hereinafter, referred to as a heat diffusion part 34a) corresponding to the location of the heat diffusion member 34 is indicated by a two-dot chain line so that the positional relationship between the cooling fins 24 and the heat diffusion member 34 can be easily understood.

In FIG. 2, seven cooling fins 24 are provided, and the cooling fins 24 are provided within the area of the heat diffusion part 34a. That is, the upper basal inner wall of the flow path-forming member 14 corresponding to the heat diffusion member 34 is the cooling fin installation section 34b. The number of cooling fins 24 provided within the area of the heat diffusion part 34a is not particularly limited. The positional relationship between the heat diffusion part 34a and the cooling fin installation section 34b is not limited to the configuration illustrated in FIG. 2, and for example, the cooling fins 24 may be arranged at a position outside the area of the heat diffusion part 34a, or the heat diffusion part 34a may be located at a position outside the cooling fin installation section 34b.

At the side inner walls 20 and 22 of the flow path-forming member 14, obstacles 36 that project from the side inner walls 20 and 22 toward the inner side of the flow path 12 are provided. This causes the refrigerant to change the direction and flow toward the cooling fins 24 without linearly flowing along the side inner walls 20 and 22 of the flow path-forming member 14.

Hereinafter, the members of the cooling structure according to the present disclosure will be described below.

<Flow Path-Forming Member>

The cooling structure includes a flow path-forming member for a refrigerant to pass through.

The material of the flow path-forming member is not particularly limited. For example, the material of the flow path-forming member may be a resin. Examples of the resin include a polyethylene-based resin, a polypropylene-based resin (PP), a composite polypropylene-based resin (PPC), a polyphenylene sulfide-based resin (PPS), a polyphthalamide-based resin (PPA), a polybutylene terephthalate-based resin (PBT), an epoxy-based resin, a phenol-based resin, a polystyrene-based resin, a polyethylene terephthalate-based resin, a polyvinyl alcohol-based resin, a vinyl chloride-based resin, an ionomer-based resin, a polyamide-based resin, an acrylonitrile-butadiene-styrene copolymer resin (ABS), and a polycarbonate-based resin.

The resin constituting the flow path-forming member may contain an inorganic filler. Examples of the inorganic filler include glass, silica, alumina, zircon, magnesium oxide, calcium silicate, calcium carbonate, potassium titanate, silicon carbide, silicon nitride, boron nitride, beryllia, and zirconia. As the inorganic filler having a flame retardant effect, aluminum hydroxide, zinc borate, or the like may be used.

(Flow Path)

The shape of the flow path formed by the flow path-forming member is not particularly limited. The cross sectional shape of the flow path may be rectangular, circular, elliptical, non-rectangular polygonal, or the like. From the viewpoint of ease of manufacturing the flow path-forming member, a rectangular shape is preferable. In the flow path, the shape of the region that includes the cooling fin installation section is preferably rectangular. Each inner wall that forms the flow path may be a flat surface or a curved surface.

The width and length of the flow path are not particularly limited, and can be appropriately set according to the size, shape, and the like of the body to be cooled.

Figure 3:
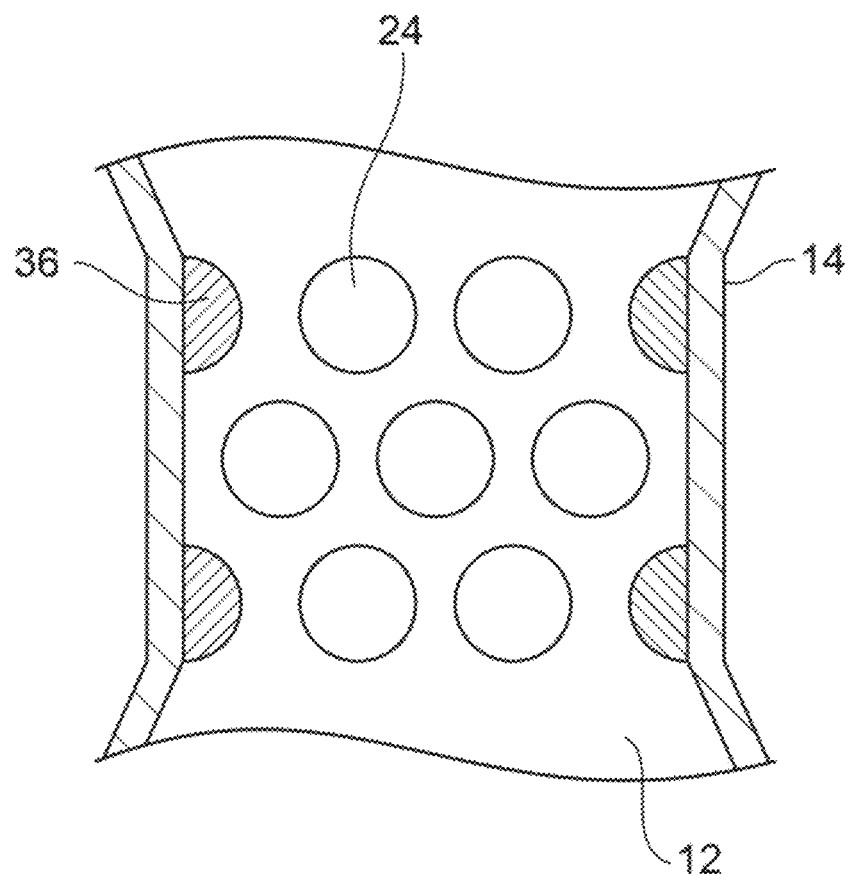
FIG. 3 is a schematic view showing a configuration of a flow path-forming member of a cooling structure in one aspect.

In one aspect, the flow path may have a narrow part at which the flow path is narrowed, and the cooling fin(s) may be provided at the narrow part of the flow path. FIG. 3 is a schematic view showing an arrangement of the flow path-forming member and the shape of the flow path in one aspect of the flow path-forming member in which cooling fins are provided in a narrow part. By the flow path having a narrow part, the amount of the refrigerant flowing through the cooling fin installation section increases, and the cooling efficiency is improved. In the case in which the flow path has a narrow part, if no obstacles are provided on the side inner walls of the flow path-forming member, the refrigerant tends to flow more along the side inner walls. In the cooling structure according to the present disclosure, since obstacle(s) are provided on the side inner walls, the refrigerant can be prevented from flowing linearly along the side inner walls, and the cooling efficiency can be improved.

(Cooling Fin Installation Section)

On a basal inner wall of the flow path-forming member, a cooling fin installation section provided with at least one cooling fin projecting from the basal inner wall toward the inner side of the flow path, the cooling fin installation section being disposed separately from the side inner walls of the flow path-forming member. The cooling fin installation section is preferably a region corresponding to the region at which a body to be cooled or a heat diffusion part connected to the body to be cooled is in contact with the flow path-forming member. In the present disclosure, the cooling fin installation section refers to a section defined as follows.

When viewing the flow path-forming member from the side toward which the cooling fin(s) project, a straight line that passes through a point of the cooling fin located closest to a side inner wall of the flow path-forming member, the point being closest to the side inner wall of the flow path-forming member, and that is parallel to the longitudinal direction of the flow path, is drawn in each of the side areas of the flow path-forming member. A straight line that passes through the furthermost upstream point of the cooling fin located the furthest upstream in the flow path and that is parallel to the width direction of the flow path, and a straight line that passes through the furthermost downstream point of the cooling fin located the furthest downstream of the flow path and that is parallel to the width direction of the flow path, are respectively drawn. The rectangular area surrounded by the four straight lines thus drawn is defined as the cooling fin installation section. In FIG. 2, a cooling fin installation section 34b obtained by the foregoing procedure is illustrated.

The number of cooling fin installation section(s) in the flow path is not particularly limited, and can be appropriately set according to the number of bodies to be cooled.

The number of cooling fin(s) in the cooling fin installation section is not particularly limited. From the viewpoint of cooling efficiency, plural cooling fins may be provided. For example, two or more cooling fins, 10 or more cooling fins, or 20 or more cooling fins may be provided in the cooling fin installation section. In the cooling fin installation section, 100 or less, 90 or less, or 80 or less cooling fins may be provided. In each cooling fin installation section, 2 to 100 cooling fins, 10 to 90 cooling fins, or 20 to 80 cooling fins may be provided.

When plural cooling fins are provided in the cooling fin installation section, the arrangement of each of the cooling fin(s) is not particularly limited. In one aspect, plural cooling fins may be arranged in the width direction of the flow path. In one aspect, plural cooling fins may be arranged in the longitudinal direction of the flow path. In one aspect, plural cooling fins may be arranged in the width direction and the longitudinal direction of the flow path. In one aspect, in order to block the flow of the refrigerant parallel to the longitudinal direction of the flow path, the cooling fins may be arranged such that plural cooling fins arranged in the width direction are arranged in plural rows in the longitudinal direction, the rows being arranged such that each row has a different position from another row in the width direction.

The shape of the cooling fin(s) is not particularly limited. The cooling fin(s) may have, for example, a cylindrical shape, an elliptic cylindrical shape, a prism-shape, a conical shape, a polygonal pyramidal shape, or the like.

The tip(s) of the cooling fin(s) may have a flat shape, a hemispherical shape, a conical shape, a pyramidal shape, or the like.

The size of the cooling fin(s) is not particularly limited. For example, the average length of the cooling fin(s) in the width direction of the flow path is preferably 0.5 mm or more, more preferably 1.0 mm or more, and still more preferably 1.5 mm or more, from the viewpoint of strength. From the viewpoint of cooling efficiency, the average length is preferably 20.0 mm or less, more preferably 15.0 mm or less, still more preferably 3.0 mm or less, and particularly preferably 2.0 mm or less. From these viewpoints, the average length is preferably 0.5 mm to 20.0 mm, more preferably 1.0 mm to 15.0 mm, still more preferably 1.5 mm to 3.0 mm, and particularly preferably 1.5 mm to 2.0 mm. The average length of the flow path of the cooling fin(s) in the width direction is an arithmetic average value of the length(s) of all the cooling fin(s) in one cooling fin installation section at the base part (i.e., the part where the cooling fin(s) intersect the basal inner wall) in the width direction.

The length of the cooling fin(s) in the projecting direction can be appropriately set based on the size of the flow path and the like. For example, the average length of the cooling fin(s) in the projecting direction is preferably 50 mm or less, and more preferably 30 mm or less, from the viewpoint of moldability. From the viewpoint of cooling efficiency, the average length is preferably 10 mm or more, and more preferably 30 mm or more.

The average length in the projecting direction of the cooling fin(s) is an arithmetic average value of the lengths of all the cooling fin(s) in one cooling fin installation section, from the base part (i.e., the part at which the cooling fin(s) intersect the basal inner wall) to the most distal end.

The material of the cooling fin(s) is not particularly limited. The material of the cooling fin(s) may be metal from the viewpoint of thermal conductivity, or may be a resin from the viewpoint of ease of processing. Examples of the resin include the resins listed as examples of the material of the flow path-forming member. The resin may or may not include an inorganic filler, examples of which are listed as the material of the flow path-forming member. The material of the cooling fin(s) may be the same as or different from the material of at least one selected from the group consisting of the flow path-forming member and the obstacle(s). The cooling fin(s) may be those in which a metal core material is covered with a resin. By coating a metal core material with a resin, insulating properties can be secured, and metal corrosion and the like can be suppressed. It is preferable that the resin covers the entire surface of the metal core material. From the viewpoint of improving cooling efficiency, one end of the core material is preferably connected to a heat diffusion part that is connected to a body to be cooled.

The surface roughness Ra of the part of the cooling fin(s) in contact with the refrigerant may be 10 μm or more, 50 μm or more, or 100 μm or more. When the surface roughness of the part of the cooling fin(s) in contact with the refrigerant is 10 μm or more, heat emissivity of the cooling fin(s) increases, and the heat tends to be efficiently transferred to the refrigerant. When the surface roughness Ra of the part of the cooling fin(s) in contact with the refrigerant is 100 μm or more, the surface area of the cooling fin(s) is larger, and the heat tends to be transferred more efficiently from the cooling fin(s) to the refrigerant. The surface roughness Ra of the part of the cooling fin(s) in contact with the refrigerant may be 500 μm or less from the viewpoint of ease of processing and the like.

In the present disclosure, the surface roughness Ra refers to a value measured in accordance with JIS B0601:2013.

Examples of the method for adjusting the surface roughness Ra of the part of the cooling fin(s) in contact with the refrigerant to 10 μm or more include a method in which the surface of the mold used for molding the flow path-forming member is provided with unevenness in accordance with the surface roughness of the cooling fin(s), with which the cooling fin(s) are resin-molded, a method in which the surface of the cooling fin(s) is processed by mechanical processing such as machining, blasting, or laser machining, and the like, to adjust the surface roughness to a desired level.

(Obstacle)

In the region corresponding to the cooling fin installation section, at least one obstacle projecting from a side inner wall toward the inner side of the flow path is provided on the side inner wall of the flow path-forming member. The obstacle(s) are provided to block the linear flow of the refrigerant along the side inner walls of the flow path and to change the direction of the flow of the refrigerant.

The shape of the obstacle(s) is not particularly limited. The cross sectional shape of the obstacle(s) as viewed from the side toward which the cooling fin(s) project may be a semicircular shape, an arch shape, a truncated circular shape, a rectangle, a non-rectangular polygon, or the like.

When viewing the cross-section of the flow path, the obstacle(s) may be provided from one basal inner wall to the other basal inner wall of the flow path-forming member, or may be provided in a part of a region from one basal inner wall to the other basal inner wall. From the viewpoint of efficiently blocking the flow of the refrigerant, the obstacle(s) are preferably provided from one basal inner wall to the other basal inner wall of the flow path-forming member.

The size of the obstacle(s) is not particularly limited. For example, the average length of the obstacle(s) in the width direction of the flow path may be 0.25 mm or more, 0.5 mm or more, 0.8 mm or more, or 1.0 mm or more. The average length of the obstacle(s) in the width direction of the flow path may be 10.0 mm or less, 7.0 mm or less, or 5.0 mm or less from the viewpoint of cooling efficiency. The length of each obstacle in the width direction of the flow path may be 0.25 mm to 10.0 mm, 0.5 mm to 10.0 mm, 0.8 mm to 7.0 mm, or 1.0 mm to 5.0 mm. The average length of the obstacle(s) in the width direction of the flow path may be in the foregoing ranges.

The average length of the obstacle(s) in the width direction is an arithmetic average value of the lengths in the width direction of all the obstacles present in the region corresponding to one cooling fin installation section. Here, the "region corresponding to the cooling fin installation section" refers to a region determined as follows. Viewing the flow path-forming member from the side toward which the cooling fin(s) project, the cooling fin installation section is extended in the width direction of the flow path-forming member to obtain straight lines at the parts at which the extended section intersects the side inner walls (the obtained two straight lines are indicated by thick lines in FIG. 6). Next, viewing from the side toward which the obstacle(s) project, the above-obtained straight lines are moved from one basal part to the other basal part of the side inner wall of the flow path-forming member, and the regions through which the straight lines pass are referred to as the "region corresponding to the cooling fin installation section". FIG. 7 shows a schematic view of one aspect of the side inner wall viewed from the side toward which the obstacle(s) extend. In FIG. 7, the thick lines correspond to the obtained straight lines. The region surrounded by the thick lines and the broken lines in FIG. 7 is a "region corresponding to the cooling fin installation section". In FIG. 7, it is illustrated that two obstacles are present in the "region corresponding to the cooling fin installation section" for one side inner wall.

The average length of the obstacle(s) in the width direction is an average of the lengths in the width direction of the obstacle(s) present in the "region corresponding to the cooling fin installation section" on the pair of side inner walls; however the average length of the obstacle(s) in the width direction present on one side inner wall may be in the foregoing ranges.

The average length of the obstacle(s) in the width direction of the flow path may be determined such that the minimum distances between the cooling fin and the side inner walls of the flow path-forming member satisfy the specific relationship described later.

The number of obstacle(s) is not particularly limited. In one aspect, plural obstacles may be provided in the region corresponding to the cooling fin installation section in the side inner walls of the flow path-forming member.

The material of the obstacle(s) is not particularly limited. From the viewpoint of ease of processing, the material of the obstacle(s) may be a resin. Examples of the resin include the resins listed as examples of the material of the flow path-forming member. The resin may or may not include an inorganic filler, examples of which are listed as the material of the flow-path forming member. The material of the obstacle(s) may be the same as or different from the material of at least one selected from the group consisting of the flow path-forming member and the cooling fin(s). The obstacle(s) may be those that are molded together with the flow path-forming member, or may be those that are manufactured separately from the flow path-forming member and integrated with the flow path-forming member.

(Arrangement of Cooling Fin and Obstacle)

In one aspect, the cooling structure may have at least one combination of an obstacle A and a cooling fin B that satisfy the relationship according to the following formula, the obstacle A being one of the at least one obstacle, and the cooling fin B being a cooling fin located closest to the obstacle A among the at least one cooling fin:

$$a \geq b \quad \text{Formula:}$$

wherein:
a is a length of the obstacle A in the width direction of the flow path; and
b is a minimum distance between the cooling fin B and the side inner walls of the flow path-forming member.

Figure 4:
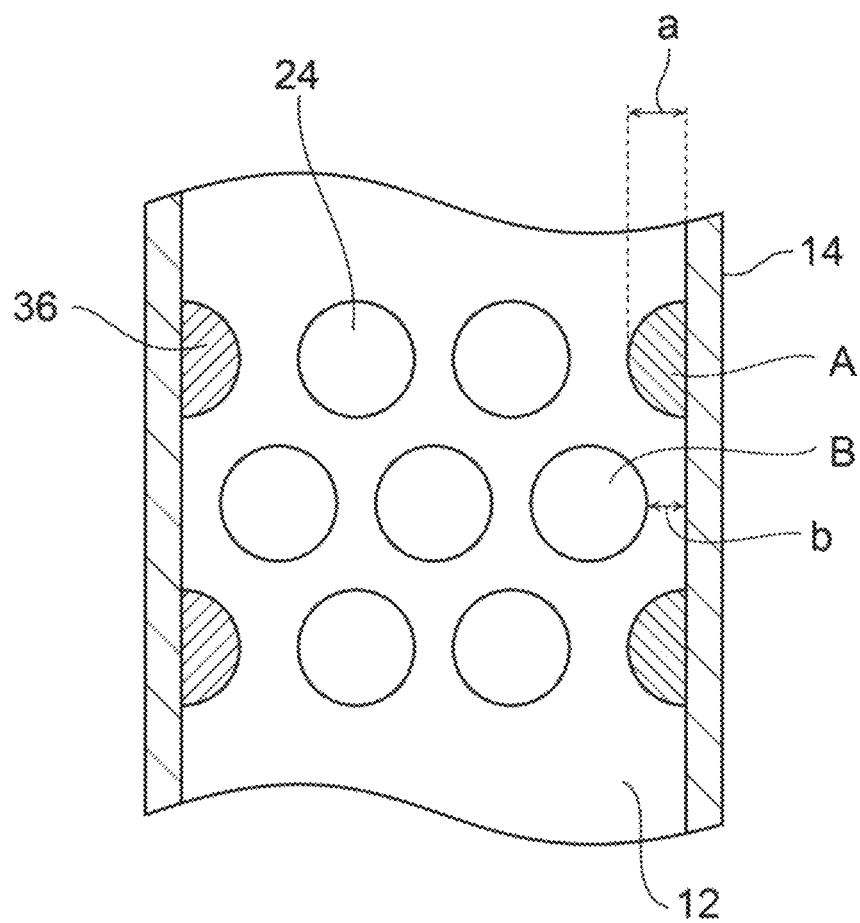
FIG. 4 is a schematic view showing a configuration of a flow path-forming member of a cooling structure in one aspect.

For example, in FIG. 4, in obstacle A, which is one of the four obstacles, and cooling fin B, which is a cooling fin located closest to the obstacle A among the seven cooling fins, the length a of the obstacle A in the width direction of the flow path, and the minimum distance b between the cooling fin B and a side inner wall of the flow path-forming member satisfy the relationship of $a \geq b$. With this configuration, the refrigerant tends to be prevented from flowing linearly along the side inner walls of the flow path-forming member, and the cooling efficiency tends to be improved.

In one aspect, the cooling structure may satisfy the relationship according to the following formula.

$$c \geq d \quad \text{Formula:}$$

wherein:
c is an average length of the at least one obstacle in the width direction of the flow path; and
d is a minimum distance between the at least one cooling fin and the side inner walls of the flow path-forming member.

Figure 5:
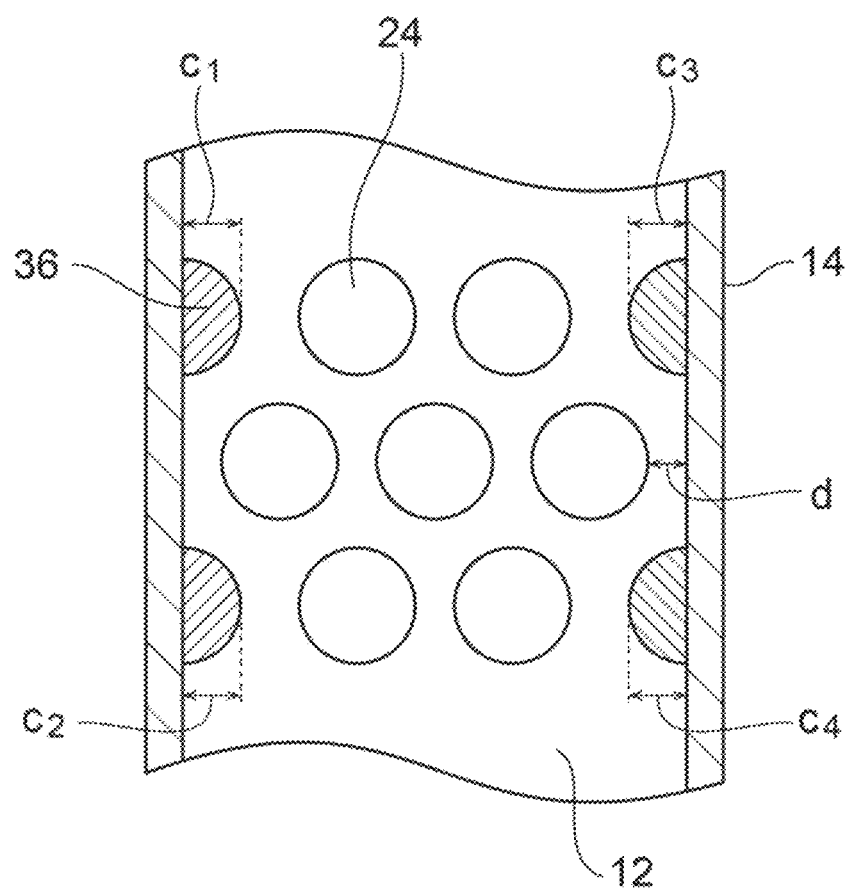
FIG. 5 is a schematic view showing a configuration of a flow path-forming member of a cooling structure in one aspect.

For example, in FIG. 5, the average value c of the lengths $c_1$ to $c_4$ of the four obstacles in the width direction and the minimum distance d between the seven cooling fins and the side inner walls of the flow path-forming member satisfy the relationship of $c \geq d$. With this configuration, the refrigerant tends to be prevented from flowing linearly along the side inner walls of the flow path-forming member, and the cooling efficiency tends to be improved.

As described above, the "average length of the at least one obstacle in the width direction of the flow path" in the foregoing c is an average of the length(s) in the width direction of the obstacle(s) present in the "region corresponding to the cooling fin installation section" in the pair of side inner walls, and the "side inner walls" in the foregoing d means the pair of side inner walls. The average length in the width direction of the obstacle(s) present in one side inner wall and the minimum distance between the flow path-forming member and the same one side inner wall may satisfy the foregoing relationship. For example, in FIG. 5, c', which is the average value of $c_3$ and $c_4$, and d may satisfy the relationship of $c' \geq d$.

In one aspect, when viewing the flow path from the side toward which the cooling fin(s) project, the at least one cooling fin and the at least one obstacle are arranged such that any straight line parallel to the flow path longitudinal direction intersects at least one selected from the group consisting of the at least one cooling fin and the at least one obstacle, within a section formed by extending the cooling fin installation section to the side inner walls of the flow path-forming member in the width direction.

Figure 6:
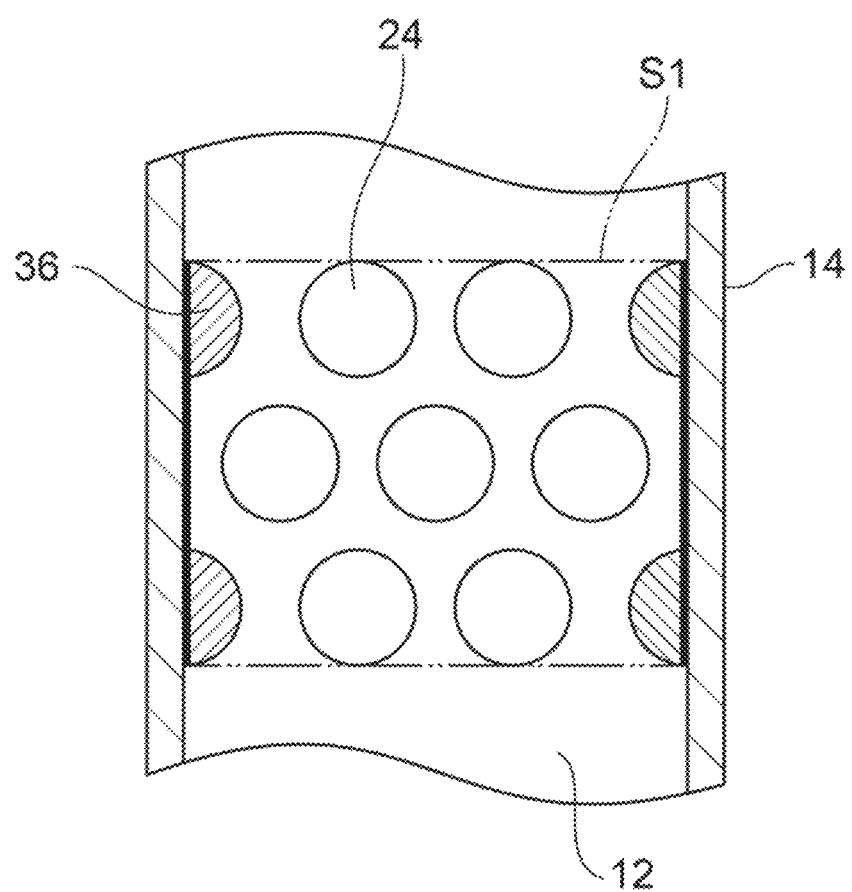
FIG. 6 is a schematic view showing a configuration of a flow path-forming member of a cooling structure in one aspect.
Figure 7:
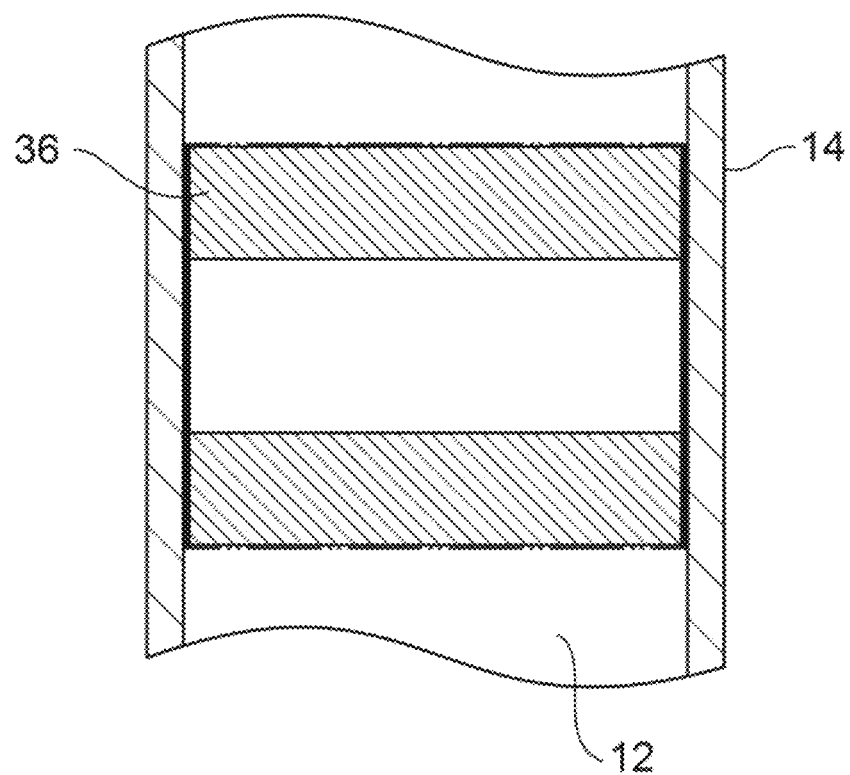
FIG. 7 is a schematic view of a side inner wall of a flow path-forming member of a cooling structure in one aspect.

For example, in FIG. 6, in section S1 formed by extending the cooling fin installation section to the side inner walls of the flow path-forming member in the width direction, any straight line parallel to the flow path longitudinal direction intersects at least one selected from the group consisting of the cooling fins and the obstacles. This tends to prevent the refrigerant from flowing linearly, increase the opportunity of the refrigerant to be in contact with the cooling fins, and improve the cooling efficiency.

<Refrigerant>

The type of the refrigerant that passes through the flow path is not particularly limited. Examples of the refrigerant include water, a liquid such as an organic solvent, and a gas such as air. The water used as the refrigerant may contain a component such as an antifreeze liquid.

<Body to be Cooled>

Examples of the body to be cooled include electronic components, such as a power semiconductor and a capacitor, in addition to the busbar listed as an example in the description of FIG. 1. In the case in which the body to be cooled is an electronic component, it is preferable to provide the cooling fin(s) at a position at which the electronic component is located in the cooling structure.

The body to be cooled may be cooled via a heat diffusion part mentioned as an example in the description of FIG. 1. The material of the heat diffusion part may be a metal such as aluminum, iron, copper, gold, silver, or stainless steel, an alloy, or the like. From the viewpoint of suppressing a load on the cooling structure due to a difference in the thermal expansion coefficients between the material constituting the flow path-forming member and the cooling fin(s) and the metal constituting the heat diffusion part, the heat diffusion part may be in a mesh shape, a punching metal, or the like.

[Method for Producing Cooling Structure]

The method for producing the cooling structure is not particularly limited, and general methods for molding a resin molded body may be adopted, such as injection molding, die slide injection molding, blow molding, compression molding, transfer molding, extrusion molding, and cast molding. Die slide injection is preferable, since high positional accuracy may be required for the production of the cooling structure. The cooling structure may be produced by combining the die slide injection molding and another molding method such as insert molding.

[Application of Cooling Structure]

The cooling structure can be widely used for cooling a heat generator. The cooling structure is particularly effective in cooling a power module including plural power semiconductors, an electronic component such as a capacitor, a busbar electrically joining these electronic components, and the like, in a vehicle mounted with a motor, such as a hybrid car or an electric car.

The disclosure of Japanese Patent Application No. 2021-011481 is incorporated herein by reference in its entirety. All documents, patent applications, and technical standards described in the specification are incorporated herein by reference to the same extent as if each individual document, patent application, and technical standard were specifically and individually indicated to be incorporated by reference.

REFERENCE SIGNS LIST

10 Cooling structure
12 Flow path
14 Flow path-forming member
16 Upper basal inner wall
18 Lower basal inner wall
20 Side inner wall
22 Side inner wall
24 Cooling fin
26 Busbar
28 Bolt
30 Nut 32 Nut body
34 Heat diffusion member
34a Heat diffusion part
34b Cooling fin installation section
36 Obstacle
A Obstacle A
B Cooling fin B
a Length in width direction of flow path of obstacle A
b Minimum distance between cooling fin B and side inner wall of flow path-forming member
$c_1$ to $c_4$ Length of flow path of obstacle in width direction
S1 Section obtained by extending the cooling fin installation section to side inner walls of flow path-forming member in the width direction

The invention claimed is:

1. A cooling structure, comprising a flow path-forming member that forms a flow path for a refrigerant, wherein:
the flow path-forming member comprises, on a basal inner wall thereof, a cooling fin installation section provided with at least one cooling fin projecting from the basal inner wall toward an inner side of the flow path, the cooling fin installation section being disposed separately from side inner walls of the flow path-forming member;
the flow path-forming member comprises, on a side inner wall thereof, at least one obstacle projecting from the side inner wall toward the inner side of the flow path; and
the cooling structure comprises at least one combination of an obstacle A and a cooling fin B that satisfy a relationship according to the following formula, the obstacle A being one of the at least one obstacle, and the cooling fin B being a cooling fin located closest to the obstacle A among the at least one cooling fin:

$$a \geq b \quad \text{Formula:}$$

wherein:
a is a length of the obstacle A in a width direction of the flow path; and
b is a minimum distance between the cooling fin B and the side inner walls of the flow path-forming member.

2. The cooling structure according to claim 1, wherein:
the flow path includes a narrow part at which the flow path is narrowed, and
the cooling fin installation section is provided at the narrow part of the flow path.

3. The cooling structure according to claim 1, wherein, when viewing the flow path from a side toward which the cooling fin projects, the at least one cooling fin and the at least one obstacle are arranged such that any straight line parallel to a flow path longitudinal direction intersects at least one selected from the group consisting of the at least one cooling fin and the at least one obstacle, within a section formed by visually extending the cooling fin installation section to the side inner walls of the flow path-forming member in a width direction.

4. The cooling structure according to claim 1, wherein an average length of the at least one cooling fin in a width direction of the flow path is from 0.5 mm to 20.0 mm.

5. The cooling structure according to claim 1, wherein an average length of the at least one obstacle in a width direction of the flow path is from 0.25 mm to 10.0 mm.

6. The cooling structure according to claim 1, wherein a plurality of the at least one cooling fin are provided in the cooling fin installation section.

7. The cooling structure according to claim 1, wherein a plurality of the at least one obstacle are provided in a region corresponding to the cooling fin installation section at the side inner walls of the flow path-forming member.

8. A cooling structure, comprising a flow path-forming member that forms a flow path for a refrigerant, wherein:
the flow path-forming member comprises, on a basal inner wall thereof, a cooling fin installation section provided with at least one cooling fin projecting from the basal inner wall toward an inner side of the flow path, the cooling fin installation section being disposed separately from side inner walls of the flow path-forming member;
the flow path-forming member comprises, on a side inner wall thereof, at least one obstacle projecting from the side inner wall toward the inner side of the flow path; and
a relationship according to the following formula is satisfied:

$$c \geq d \quad \text{Formula:}$$

wherein:
c is an average length of the at least one obstacle in a width direction of the flow path; and
d is a minimum distance between the at least one cooling fin and the side inner walls of the flow path-forming member.

9. The cooling structure according to claim 8, wherein:
the flow path includes a narrow part at which the flow path is narrowed, and
the cooling fin installation section is provided at the narrow part of the flow path.

10. The cooling structure according to claim 8, comprising at least one combination of an obstacle A and a cooling fin B that satisfy a relationship according to the following formula, the obstacle A being one of the at least one obstacle, and the cooling fin B being a cooling fin located closest to the obstacle A among the at least one cooling fin:

$$a \geq b \quad \text{Formula:}$$

wherein:
a is a length of the obstacle A in a width direction of the flow path; and
b is a minimum distance between the cooling fin B and the side inner walls of the flow path-forming member.

11. The cooling structure according to claim 8, wherein, when viewing the flow path from a side toward which the cooling fin projects, the at least one cooling fin and the at least one obstacle are arranged such that any straight line parallel to a flow path longitudinal direction intersects at least one selected from the group consisting of the at least one cooling fin and the at least one obstacle, within a section formed by visually extending the cooling fin installation section to the side inner walls of the flow path-forming member in a width direction.

12. The cooling structure according to claim 8, wherein an average length of the at least one cooling fin in a width direction of the flow path is from 0.5 mm to 20.0 mm.

13. The cooling structure according to claim 8, wherein an average length of the at least one obstacle in a width direction of the flow path is from 0.25 mm to 10.0 mm.

14. The cooling structure according to any claim 8, wherein a plurality of the at least one cooling fin are provided in the cooling fin installation section.

15. The cooling structure according to claim 8, wherein a plurality of the at least one obstacle are provided in a region corresponding to the cooling fin installation section at the side inner walls of the flow path-forming member.

* * * * *